(12) United States Patent
Liu et al.

(10) Patent No.: US 11,509,318 B2
(45) Date of Patent: Nov. 22, 2022

(54) VOLTAGE CONTROLLED OSCILLATOR STRUCTURE AND PHASE-LOCKED LOOP

(71) Applicant: SHANGHAI HUALI MICROELECTRONICS CORPORATION, Shanghai (CN)

(72) Inventors: Yuchun Liu, Shanghai (CN); Zhili Wang, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 4 days.

(21) Appl. No.: 17/327,294

(22) Filed: May 21, 2021

(65) Prior Publication Data
US 2022/0029628 A1    Jan. 27, 2022

(30) Foreign Application Priority Data
Jul. 23, 2020 (CN) .......................... 202010717303.0

(51) Int. Cl.
*H03L 7/099* (2006.01)
*H03B 5/12* (2006.01)

(52) U.S. Cl.
CPC ......... *H03L 7/0997* (2013.01); *H03B 5/1228* (2013.01)

(58) Field of Classification Search
CPC ............................ H03B 5/1228; H03L 7/0997

USPC ........................................................... 331/57
See application file for complete search history.

(56) References Cited

U.S. PATENT DOCUMENTS 7,977,985 B2 * 7/2011 Vlasenko ............. H03H 11/265
327/157
8,054,139 B2 * 11/2011 Fernandez ........... H03K 3/0322
331/57

* cited by examiner

*Primary Examiner* — Arnold M Kinkead
(74) *Attorney, Agent, or Firm* — Alston & Bird LLP (57) ABSTRACT

The present invention includes a voltage controlled oscillator circuit and a phase-locked loop device. The voltage controlled oscillator circuit comprises: a voltage-to-current conversion module, used for converting a control voltage of a voltage controlled oscillator into a control current as a linear function of the control voltage; and a current controlled oscillation module, used for outputting a low-amplitude oscillation signal based on the control current, so as to reduce power consumption. Further provided in the present invention is a phase-locked loop device comprising the voltage controlled oscillator circuit. According to the voltage controlled oscillator circuit, design parameters of low power consumption and high linearity may be achieved, thereby making a gain Kvco of the voltage controlled oscillator relatively stable, and it may be ensured that the voltage controlled oscillator and the phase-locked loop comprising the same have relatively excellent device performance.

16 Claims, 4 Drawing Sheets

VOLTAGE CONTROLLED OSCILLATOR STRUCTURE AND PHASE-LOCKED LOOP

CROSS-REFERENCES TO RELATED APPLICATIONS

This application claims the priority to Chinese patent application No. CN202010717303.0, filed on Jul. 23, 2020, and entitled "VOLTAGE CONTROLLED OSCILLATOR STRUCTURE AND PHASE-LOCKED LOOP", the disclosure of which is incorporated herein by reference in its entirety.

TECHNICAL FIELD

The present invention relates to the field of semiconductor device circuit design, in particular, to a circuit of voltage controlled oscillator in a phase-locked loop.

BACKGROUND

A phase-locked loop has a frequency stabilization feature and generates a series of periodic accurate and stable frequency signals, which provide a stable clock frequency for other modules in a circuit system. Meanwhile, the phase-locked loop may correct a duty cycle of a clock signal, so as to eliminate a delay generated in the distribution of the clock to ensure synchronization and synchronicity of the clocks among different modules. It can be considered that a phase-locked loop as a clock circuit is an important component in a centralized integrated circuit system and has a wide variety of application scenes.

At present, the phase-locked loop integrated in a CMOS image sensor circuit mainly adopts the standard CMOS process. With continuous reduction of feature sizes, working frequencies of the phase-locked loop also reaches giga-hertz (GHz) level. Nowadays, major concerns in design indexes of designing the phase-locked loop include high speed, high integration level, wide adjustability range, low voltage, low power consumption, and low noise, etc. Common charge-pump-type phase-locked loops typically include a phase discriminator, a filter, a voltage controlled oscillator, and a frequency divider. The voltage controlled oscillator is used for generating an internal frequency that is compared with an external reference frequency, such that the voltage controlled oscillator is one of important components in the phase-locked loop. It is fair to say that a frequency range, a noise feature and a power consumption condition of the voltage controlled oscillator greatly affect the overall performance of the phase-locked loop. Therefore, the voltage controlled oscillator is particularly important in the design of a phase-locked loop circuit.

Figure 1:
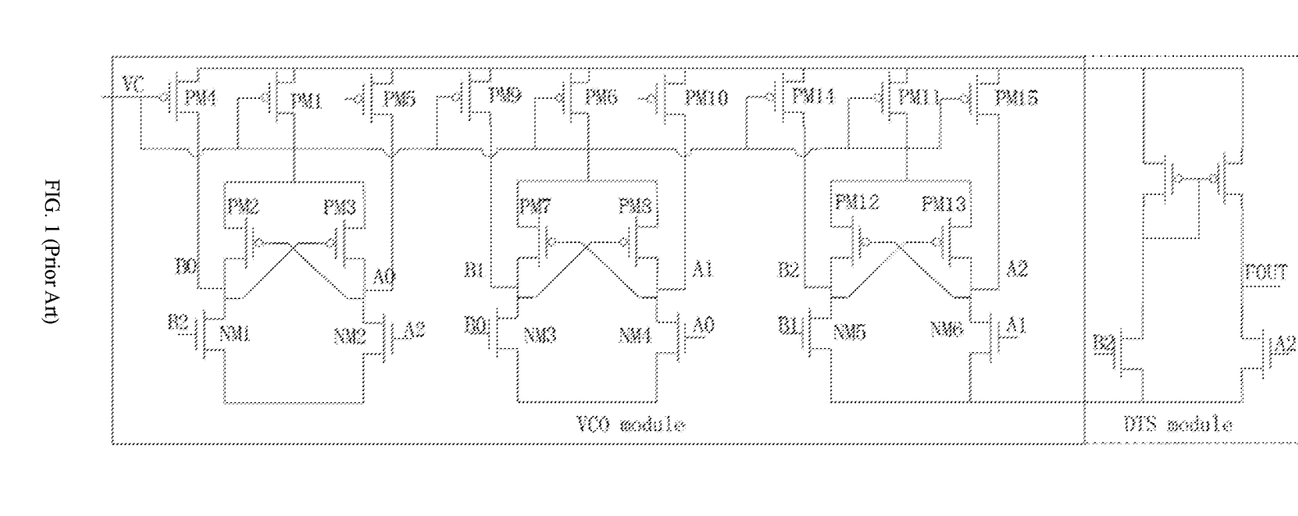
FIG. 1 shows a structural schematic diagram of a current common voltage controlled oscillator.

At the present time, a typical structure of an existing common voltage controlled oscillator is as shown in FIG. 1, the voltage controlled oscillator (VCO) is circuit comprising fully differentiated ring oscillators, its three stages of identical delay units are connected end to end in a reverse phase manner, and the last stage is output through a shaping output module DTS. As shown in FIG. 1, for the first-stage delay unit, NM1 and NM2 are differential input pair transistors. PM2 and PM3 are of phase locked structures for accelerating an overturning speed and improving stability. Herein, PM1 serves as a resistor controlled by a control voltage VC, and PM4 and PM5 are also controlled by an external input voltage VC, such that a current and a load of the whole delay unit are controlled, and finally an oscillation frequency output by the voltage controlled oscillator is controlled.

However, the voltage controlled oscillator structure in the prior art is high in power consumption and low in voltage to frequency linearity. Therefore, in the prior art, the performance of the voltage controlled oscillator is poor, and accordingly, the phase-locked loop with excellent performance may not be formed.

In view of this, a novel voltage controlled oscillator structure is expected to be developed for overcoming the defects that in the prior art, the voltage controlled oscillator is large in power consumption and low in voltage to frequency linearity, thereby providing the possibility of forming a phase-locked loop with low power consumption and high performance.

BRIEF SUMMARY

The following presents a simplified summary of one or more embodiments in order to provide a basic understanding of these embodiments. This summary is not an extensive overview of all conceivable embodiments and is not intended to identify key or critical elements of all embodiments or delimit the scope of any or all embodiments. The sole purpose is to present some concepts of one or more embodiments in a simplified form as a prelude to the more detailed description that is presented later.

For solving the problems of high power consumption and low voltage to frequency linearity in existing voltage controlled oscillator, one embodiment of the present invention provides a voltage controlled oscillator structure, including: a voltage-to-current conversion module, wherein the voltage-to-current conversion module converts a control voltage VC of the voltage controlled oscillator into a control current IM, wherein the control current IM is a linear function of the control voltage VC; and a current controlled oscillation module, wherein the current controlled oscillation module inputs the control current IM and outputs a low-amplitude oscillation signal to reduce power consumption.

In some examples, the current controlled oscillation module comprises fully differentiated ring oscillators.

In some examples, the current controlled oscillation module comprises n stages of anti-phase cascaded delay units, wherein an output of a last-stage of the n stages of anti-phase cascaded delay units is connected to an input terminal of a first-stage of the n stages of anti-phase cascaded delay units in an anti-phase manner, wherein n is an odd number greater than 1.

In some examples, each of the n stages of anti-phase cascaded delay units comprises: a current control module and a pair of differential transistors; wherein the current control module controls a flow direction of a current, so as to switch on or switch off the pair of differential transistors; and wherein the pair of differential transistors outputs the low-amplitude oscillation signal.

In some examples, the current control module comprises a first PMOS transistor, a second PMOS transistor, and a third PMOS transistor, wherein: a gate electrode of the first PMOS transistor connects to an input end of the current control module; a source electrode of the first PMOS transistor connects to a supply voltage; and a drain current of the first PMOS transistor mirrors the control current IM, and a drain electrode of the first PMOS transistor connects to source electrodes of the second PMOS transistor and the third PMOS transistor.

In some examples, the pair of differential transistors comprises a first NMOS transistor and a second NMOS transistor, wherein each of the first and the second NMOS transistors is connected with a clamping diode respectively;

wherein a gate electrode of the first NMOS transistor and a gate electrode of the second PMOS transistor are connected to form a first input end of the n stages of anti-phase cascaded delay units; a gate electrode of the second NMOS transistor and a gate electrode of the third PMOS transistor are connected to form a second input end of the n stages of anti-phase cascaded delay units; a drain electrode of the first NMOS transistor and a drain electrode of the second PMOS transistor are connected to form a first output end of the n stages of anti-phase cascaded delay units; a drain electrode of the second NMOS transistor and a drain electrode of the third PMOS transistor are connected to form a second output end of the n stages of anti-phase cascaded delay units; a first clamping diode of the first NMOS transistor is connected between a source electrode and the drain electrode of the first NMOS transistor, and a positive electrode of the first clamping diode is the drain electrode of the first NMOS transistor; and a second clamping diode of the second NMOS transistor is connected between a source electrode and the drain electrode of the second NMOS transistor, and a positive electrode of the second clamping diode is the drain electrode of the second NMOS transistor.

In some examples, the first clamping diode is a third NMOS transistor with a gate electrode and a drain electrode in short circuit, wherein the drain electrode of the third NMOS transistor is connected to the drain electrode of the first NMOS transistor, and wherein a source electrode of the third NMOS transistor is connected to the source electrode of the first NMOS transistor; and wherein the second clamping diode is a fourth NMOS transistor with a gate electrode and a drain electrode in short circuit, wherein the drain electrode of the fourth NMOS transistor is connected to the drain electrode of the second NMOS transistor, and wherein a source electrode of the fourth NMOS transistor is connected to the source electrode of the second NMOS transistor.

In some examples, the voltage controlled oscillator circuit further comprises an output conversion module, wherein the output conversion module amplifies double-end oscillation signals output from the fully differentiated ring oscillators and converts the double-end oscillation signals into a single-end oscillation output signal.

In some examples, the output conversion module comprises a fifth NMOS transistor, a sixth NMOS transistor, a fourth PMOS transistor and a fifth PMOS transistor; wherein a gate electrode of the fifth NMOS transistor and a gate electrode of the sixth NMOS transistor are connected to double output ends of the fully differentiated ring oscillators respectively; wherein a drain electrode of the fifth NMOS transistor is connected to a drain electrode of the fourth PMOS transistor, wherein the drain electrode and a gate electrode of the fourth PMOS transistor are in short circuit and are connected to the gate electrode of the fifth PMOS transistor; and wherein a drain electrode of the fifth PMOS transistor and a drain electrode of the sixth NMOS transistor are connected to form an output end of the output conversion module.

In some examples, the voltage-to-current conversion module comprises a seventh NMOS transistor and an eighth NMOS transistor; wherein a gate electrode of the seventh NMOS transistor and a gate electrode of the eighth NMOS transistor are connected to the control voltage VC, and a drain electrode of the seventh NMOS transistor and a drain electrode of the eighth NMOS transistor are connected in parallel to output the control current IM; and wherein the seventh NMOS transistor and the eighth NMOS transistor have different threshold voltage intervals, so as to expand an available range of the control voltage VC of the voltage-to-current conversion module.

In some examples, the seventh NMOS transistor is a depletion NMOS transistor, and the eighth NMOS transistor is an enhanced NMOS transistor; or wherein the seventh NMOS transistor is an enhanced NMOS transistor, and the eighth NMOS transistor is a depletion NMOS transistor.

In some examples, a source electrode of the seventh NMOS transistor connects to a first end of a first resistor, and a second end of the first resistor is grounded, and wherein a source electrode of the eighth NMOS transistor connects to a first end of a second resistor and the second end of the second resistor is grounded, so as to improve the linearity between the control voltage VC and the control current IM.

In some examples, the voltage controlled oscillator circuit further comprises a sixth PMOS transistor, wherein the control current IM from the output of the voltage-to-current conversion module is mirrored to the current controlled oscillation module by means of the sixth PMOS transistor.

According to another embodiment, a phase-locked loop device is provided which comprises a phase discriminator, a filter, a frequency divider, and the voltage controlled oscillator circuit as described above.

According to the voltage controlled oscillator structure provided by one embodiment of the present invention, the voltage controlled oscillator is guaranteed to have relatively high voltage to frequency linearity by means of the voltage-to-current conversion module, and the current controlled oscillation module outputs a low-amplitude oscillation signal to reduce the power consumption of the voltage controlled oscillator, thereby achieving design indexes of low power consumption and high linearity of the voltage controlled oscillator, a gain Kvco of the voltage controlled oscillator is relatively stable, the voltage controlled oscillator can be guaranteed to have relatively excellent device performance, and possibility is provided for further constructing a phase-locked loop with excellent performance. Another embodiment of the present invention provides a phase-locked loop using the voltage controlled oscillator structure, such that the phase-locked loop provided by another embodiment of the present invention also has the advantage of low power consumption and excellent performance.

BRIEF DESCRIPTION OF THE DRAWINGS

The foregoing features and advantages of the present invention can be better understood upon reading the detailed description of embodiments of the present disclosure in conjunction with the following drawings. In the drawings, the components are not necessarily drawn to scale, and components having similar related characteristics or features may have the same or similar reference numbers.

REFERENCE NUMBERS IN THE FIGURES

410 Phase discriminator
420 Charge pump
430 Low pass filter
440 Voltage controlled oscillator
450 Frequency divider

DETAILED DESCRIPTION OF THE DISCLOSURE

The present invention relates to the field of semiconductor device circuit design. More specifically, the embodiment of the present invention provides the circuit of a voltage controlled oscillator structure, and the voltage controlled oscillator structure formed according to a manufacturing method provided by the embodiment of the present invention improves a voltage to frequency linearity degree by means of a voltage-to-current conversion unit and reduces the power consumption of the whole voltage controlled oscillator by limiting an amplitude of an oscillation signal output by the current controlled oscillation module, thereby effectively reducing the power consumption and improving the device performance. Other embodiments are also provided in the present invention.

The following description is provided to enable those skilled in the art to implement and use the present invention and incorporate it into a specific application background. Various modifications, as well as various uses in different applications, will be readily apparent to those skilled in the art, and the general principles defined herein may be applied to embodiments in a broader range. Thus, the present invention is not limited to the embodiments presented herein but is to encompass the broadest scope consistent with the principles and novelty features disclosed herein.

In the following detailed description, numerous specific details are set forth in order to provide a more thorough understanding of the present invention. However, it will be apparent to those skilled in the art that the practice of the present invention may not be limited to these specific details. In other words, well-known structures and devices are shown in block diagram form without detail in order to avoid obscuring the present invention.

A reader may note that all documents and literatures which are filed concurrently with this description and which are open to public inspection to this description and the contents of all such documents and literatures are incorporated herein by reference. All features disclosed in this description (including any appended claims, abstract and drawings) may be replaced with alternative features serving the same, equivalent or similar purpose, unless otherwise indicated directly. Thus, unless otherwise stated expressly, each feature disclosed is only one example of a set of equivalent or similar features.

It is to be noted that when used, the signs left, right, front, back, top, bottom, forward, reverse, clockwise, and counterclockwise are used merely for the purpose of convenience and do not imply any particular fixed orientation. In fact, they are used to reflect a relative position and/or orientation between various parts of an object.

The terms, "over", "under", "between", and "on" as used herein, refer to the relative position of this layer with respect to other layers. Likewise, for example, one layer deposited or placed over or under another layer may make direct contact with another layer or may have one or more intermediate layers. Further, a layer deposited or placed between layers may make direct contact with these layers, or may have one or more intermediate layers. In contrast, a first layer, "on" a second layer, makes contact with the second layer. Further, the relative position of one layer with respect to other layers is provided (assuming deposition, modification, and removal operations of a thin film with respect to an initial substrate irrespective of the absolute orientation of the substrate).

The present invention will be described in detail in conjunction with the accompanying drawings and the specific embodiments. It should be noted that the embodiments described below in conjunction with the accompanying drawings and the specific embodiments are merely exemplary and should not be construed as limiting the scope of protection of the present invention.

As described above, for solving the problems of high power consumption and poor voltage to frequency linearity of a voltage controlled oscillator in the prior art, the present invention provides a voltage controlled oscillator structure, including a voltage-to-current conversion module (VI module) and a current controlled oscillation module (CCO module). The voltage-to-current conversion module (VI module) is used for improving the linearity between a voltage and a current, and the current controlled oscillation module (CCO module) is used for outputting a low-amplitude oscillation signal on the basis of a control current IM converted by the voltage-to-current conversion module, thereby effectively reducing the power consumption of a device.

Figure 2:
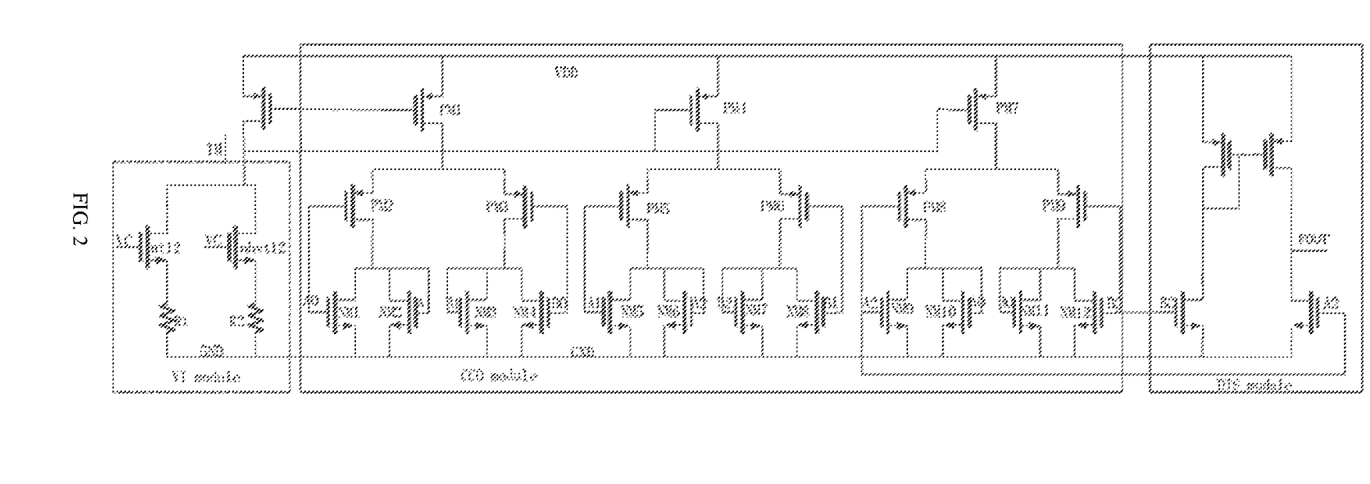
FIG. 2 shows a schematic diagram of a voltage controlled oscillator structure according to one embodiment of the present invention.

The voltage controlled oscillator structure provided by one embodiment of the present invention may be better understood with reference to FIG. 2. FIG. 2 shows a structural schematic diagram of a preferred embodiment of the voltage controlled oscillator described above. In the preferred embodiment of the voltage controlled oscillator shown in FIG. 2, an input end, that is, a control voltage VC, of the voltage controlled oscillator is converted into a control current IM by means of the voltage-to-current conversion module (VI module), and then the control current is mirrored to an input end of the current controlled oscillation module (CCO module) by means of a current mirror, passes through the current controlled oscillation module (CCO module), and then forms a low-amplitude oscillation signal (A2, B2).

The voltage-to-current module (VI module), in one embodiment, is mainly formed by connecting two NMOS transistors with different threshold voltage intervals in parallel. Gate electrodes of the two NMOS transistors are connected to the control voltage VC, drain ends of the two NMOS transistors are connected in parallel to output a converted control current IM, and source ends of the two NMOS transistors are connected in parallel to the ground. By using the two NMOS transistors with different threshold voltage intervals, an available range of the VC may be effectively expanded.

In a preferred embodiment, one of the two NMOS transistors is a depletion transistor, and the other is an enhanced transistor. It may be understood that when an input voltage is small, the voltage-to-current of the depletion transistor has a linear relation, and when the input voltage is large, the voltage-to-current of the enhancement transistor has a linear relation. By using such a mode that the depletion transistor and the enhancement transistor are connected in parallel, an available range of an input voltage with an input voltage-to-current linear relation may be effectively expanded.

In a preferred embodiment as shown in FIG. 2, one of the two NMOS transistors is a depletion transistor nt12, and the other is an enhancement transistor nhvt12. It can be understood that a threshold voltage of the depletion transistor nt12 is very low and is close to 0 or even a negative value, and the voltage-to-current of the depletion transistor nt12 has a linear relation only when the control voltage VC is very low, and has a nonlinear relation when the control voltage VC is relatively high, that is, the current is almost a fixed value and does not change along with the change of the input voltage, resulting in the available range of the control voltage VC with a voltage-to-current linear relation becoming small. The enhancement transistor nhvt12 has a high threshold voltage and may be started only by means of a large control voltage VC, the voltage-to-current of the enhancement transistor nhvt12 has a linear relation only when the control voltage VC is large, and has a nonlinear relation when the control voltage VC is small, resulting in the available range of the control voltage VC with a voltage-to-current linear relation becoming small. However, in the preferred embodiment shown in FIG. 2, by using a mode that the depletion transistor nt12 and the enhancement transistor nhvt12 are connected in parallel, the disadvantages thereof can be complemented with each other, thereby providing a control voltage with a relatively large available range.

In the embodiments described above, a control voltage VC with an available range between 0.2-0.9 V may be provided. When the input control voltage VC is in the above interval, the input voltage and the output current of the voltage-to-current conversion module (VI module) have a good linear relation. The range of the available control voltage VC is larger, such that the voltage controlled gain Kvco may be smaller. Meanwhile, the output control current IM and the input control voltage VC are in a linear relation, such that an output frequency of the oscillation signal finally output by the voltage controlled oscillator and the input control voltage VC are in a linear relation, which further guarantees the stability of Kvco.

More preferably, the source electrodes of the two NMOS transistors in the voltage-to-current conversion module (VI module) pass through resistors separately and then are grounded, which forms the NMOS transistors with negative feedback of the source electrodes. As the resistors R1 and R2 shown in FIG. 2, it can be understood that due to the resistors R1 and R2, the smoothness of the linearity between the input voltage and the output current may be further improved, and thus the performance of the voltage-to-current conversion module may be improved.

The current controlled oscillation module (CCO module) is fully differentiated ring oscillators in one embodiment. Further, the fully differentiated ring oscillators includes n stages of anti-phase cascaded delay units, output of the last-stage delay unit being connected to an input end of the first-stage delay unit in anti-phase manner, wherein n is an odd number greater than 1. Meanwhile, an output end of the last-stage delay unit, that is, the output end of the current controlled oscillation module (CCO module), may also be understood to output the oscillation signal of the voltage controlled oscillator.

FIG. 2 shows a structural schematic diagram of the current controlled oscillation module (CCO module). It should be noted that for a ring oscillator as shown in FIG. 2, the number of delay units thereof must be an odd number greater than 1 to start oscillation. Those skilled in the art may select and set appropriate stages of delay units according to actual needs of the oscillator, and the more the stages of delay units are, the lower the output frequency of the delay units is. In a preferred embodiment as shown in FIG. 2, provided are three stages of identical delay units connected end-to-end in an anti-phase manner.

Furthermore, each delay unit further includes a current control module and a differential pair of transistors. The current control module is used for controlling a flow direction of the current, so as to switch on or switch off the pair of differential transistors, and the pair of differential transistors are used for outputting the low-amplitude oscillation signal.

The specific condition of the delay unit provided by one embodiment of the present invention may be understood in connection with FIG. 2. The current control module mainly includes three PMOS transistors, which corresponds to PM1, PM2 and PM3 in the first delay unit, PM4, PM5 and PM6 in the second delay unit, and PM7, PM8 and PM9 in the third delay unit in the FIG. 2. The PM1 transistor, the PM4 transistor and the PM7 transistor are mainly used for mirroring the control current IM mirrored by the voltage-to-current conversion module.

The output end of the voltage-to-current conversion module (VI module) is the drain electrodes of the two NMOS transistors, that is, the drain current IM is the control current output by the voltage-to-current conversion module (VI module). For making the control current applied to the current controlled oscillator, one embodiment of the present invention is that the provided voltage controlled oscillator further includes a PMOS transistor serving as a current mirror, for example, a PM0 transistor shown in FIG. 2. A drain end of the PM0 transistor is connected to the output end of the voltage-to-current conversion module (VI module), a source electrode of the PM0 transistor is connected to a drain voltage VDD, and a gate electrode and a drain electrode of the PM0 transistor are in short circuit and are connected to gate electrodes of the PM1 transistor, the PM4 transistor and the PM7 transistor of the delay unit separately, thereby forming a current mirror structure, and making the PM1 transistor, the PM4 transistor and the PM7 transistor mirror the output control current of the voltage-to-current conversion module.

A current output by a drain electrode of the PM1 transistor flows to source electrodes of the PM2 transistor and the PM3 transistor, and the current is controlled to flow to a pair of differential transistors NM4 or NM1 according to the on-off condition of the PM2 transistor and the PM3 transistor, that is, switching of the differential pair of transistors NM4 and NM1 is controlled.

The 1 pair of differentia transistors NM1 and NM4 in the first delay unit are both provided with clamping diodes, the gate electrode of the NM1 transistor and the gate electrode of the PM2 transistor are in short circuit to form a first input end of the first delay unit, and the gate electrode of the NM4 transistor and the gate electrode of the PM3 transistor are in short circuit to form a second input end of the first delay unit. A drain electrode of the NM1 transistor and a drain electrode of the PM2 transistor are in short circuit to form a first output end of the first delay unit, and a source electrode of the NM1 transistor is grounded. A drain electrode of the NM4 transistor and a drain electrode of the PM3 transistor are in short circuit to form a second output end of the first delay unit, and a source electrode of the NM4 transistor is grounded.

A conduction direction of the clamping diode connected between the source electrode and the drain electrode of the NM1 transistor is from the drain electrode to the source electrode of the NM1 transistor, that is, a positive electrode of the clamping diode is the drain electrode of the NM1 transistor. A conduction direction of the clamping diode connected between the source electrode and the drain electrode of the NM4 transistor is from the drain electrode to the source electrode of the NM4 transistor, that is, a positive electrode of the clamping diode is the drain electrode of the NM4 transistor. The clamping diode plays a role in limiting an oscillation amplitude, such that an output signal of the first delay unit is a low-amplitude signal, thereby effectively reducing the power consumption of the whole voltage controlled oscillator.

The voltage controlled oscillator provided by the present invention is constructed on a CMOS structure, such that the clamping diode is achieved by CMOS transistors connected by diodes in consideration of layout design. Specifically, the clamping diode of the NM1 transistor is achieved by an NMOS transistor (NM2 transistor) of which a drain electrode and a gate electrode are in short circuit, a drain electrode of the NM2 transistor is connected to a drain electrode of the NM1 transistor, and a source electrode of the NM2 transistor is grounded. The clamping diode of the NM4 transistor is achieved by an NMOS transistor (NM3 transistor) of which a drain electrode and a gate electrode are in short circuit, a drain electrode of the NM3 transistor is connected to a drain electrode of the NM4 transistor, and a source electrode of the NM3 transistor is grounded.

It can be seen from a circuit structure of the delay unit that when the PM2 transistor is switched on, the NM1 transistor is switched off, the PM3 transistor is switched off, the NM4 transistor is switched on, and the current flows to the NM4 transistor, is clamped by the NM3 transistor and then is output from the second output end. When the PM3 transistor is switched on, the NM4 transistor is switched off, the PM2 transistor is switched off, the NM1 transistor is switched on, and the current flows to the NM1 transistor, is clamped by the NM2 transistor and then is output from the first output end.

Similarly, as for the second delay unit, a current output by a drain electrode of the PM4 transistor flows to source electrodes of the PM5 transistor and the PM6 transistor, and the current is controlled to flow to the pair of differential transistors NM8 or NM5 according to the on-off condition of the PM5 transistor and the PM6 transistor, that is, switching of the pair of differential transistors NM8 and NM5 is controlled.

The pair of differential transistors NM5 and NM8 in the second delay unit are both provided with clamping diodes, the gate electrode of the NM5 transistor and the gate electrode of the PM5 transistor are in short circuit to form a first input end of the second delay unit, and the gate electrode of the NM8 transistor and the gate electrode of the PM6 transistor are in short circuit to form a second input end of the second delay unit. As described above, the output of the first delay unit is connected to the input of the second delay unit in an anti-phase manner, thus the first and second input ends of the second delay unit are connected to the first and second output ends of the first delay unit, that is, a point A1 and a point B1. A drain electrode of the NM5 transistor and a drain electrode of the PM5 transistor are in short circuit to form a first output end of the second delay unit, and a source electrode of the NM5 transistor is grounded. A drain electrode of the NM8 transistor and a drain electrode of the PM6 transistor are in short circuit to form a second output end of the second delay unit, and a source electrode of the NM8 transistor is grounded.

A conduction direction of the clamping diode connected between the source electrode and the drain electrode of the NM5 transistor is from the drain electrode to the source electrode of the NM5 transistor, that is, a positive electrode of the clamping diode is the drain electrode of the NM5 transistor. A conduction direction of the clamping diode connected between the source electrode and the drain electrode of the NM5 transistor is from the drain electrode to the source electrode of the NM5 transistor, that is, a positive electrode of the clamping diode is the drain electrode of the NM5 transistor. The clamping diode plays a role in limiting an oscillation amplitude, such that an output signal of the second delay unit is a low-amplitude signal, thereby effectively reducing the power consumption of the whole voltage controlled oscillator.

Similarly, the voltage controlled oscillator provided by the present invention is constructed on a CMOS structure, such that the clamping diode is achieved by CMOS transistors connected by diodes in consideration of layout design. Specifically, the clamping diode of the NM5 transistor is achieved by an NMOS transistor (NM6 transistor) of which a drain electrode and a gate electrode are in short circuit, a drain electrode of the NM6 transistor is connected to a drain electrode of the NM5 transistor, and a source electrode of the NM6 transistor is grounded. The clamping diode of the NM8 transistor is achieved by an NMOS transistor (NM7 transistor) of which a drain electrode and a gate electrode are in short circuit, a drain electrode of the NM7 transistor is connected to a drain electrode of the NM8 transistor, and a source electrode of the NM7 transistor is grounded.

It can be seen from a circuit structure of the delay unit that when the PM5 transistor is switched on, the NM5 transistor is switched off, the PM6 transistor is switched off, the NM8 transistor is switched on, and the current flows to the NM8 transistor, is clamped by the NM7 transistor and then is output from the second output end. When the PM5 transistor is switched on, the NM8 transistor is switched off, the PM3 transistor is switched off, the NM5 transistor is switched on, and the current flows to the NM5 transistor, is clamped by the NM3 transistor and then is output from the first output end.

As for the third delay unit, a current output by a drain electrode of the PM7 transistor flows to source electrodes of the PM8 transistor and the PM9 transistor, and the current is controlled to flow to one of the pair of differential transistors NM12 or NM9 according to the on-off condition of the PM8 transistor and the PM9 transistor, that is, switching of the pair of differential transistors NM12 and NM9 is controlled.

The pair of differential transistors NM9 and NM12 in the third delay unit are both provided with clamping diodes, the gate electrode of the NM9 transistor and the gate electrode of the PM8 transistor are in short circuit to form a first input end of the third delay unit, and the gate electrode of the NM12 transistor and the gate electrode of the PM9 transistor are in short circuit to form a second input end of the third delay unit. As described above, the output of the second delay unit is connected to the input of the third delay unit in an anti-phase manner, thus the first and second input ends of the third delay unit are connected to the first and second output ends of the second delay unit, that is, a point A2 and a point B2. A drain electrode of the NM9 transistor and a drain electrode of the PM8 transistor are in short circuit to form a first output end of the third delay unit, and a source electrode of the NM9 transistor is grounded. A drain electrode of the NM12 transistor and a drain electrode of the PM9 transistor are in short circuit to form a second output end of the third delay unit, and a source electrode of the NM12 transistor is grounded.

A conduction direction of the clamping diode connected between the source electrode and the drain electrode of the NM9 transistor is from the drain electrode to the source electrode of the NM9 transistor, that is, a positive electrode of the clamping diode is the drain electrode of the NM9 transistor. A conduction direction of the clamping diode connected between the source electrode and the drain electrode of the NM9 transistor is from the drain electrode to the source electrode of the NM9 transistor, that is, a positive electrode of the clamping diode is the drain electrode of the NM9 transistor. The clamping diode plays a role in limiting an oscillation amplitude, such that an output signal of the third delay unit is a low-amplitude signal, thereby effectively reducing the power consumption of the whole voltage controlled oscillator.

Similarly, the voltage controlled oscillator provided by the present invention is constructed on a CMOS structure, such that the clamping diode is achieved by CMOS transistors connected by diodes in consideration of layout design. Specifically, the clamping diode of the NM9 transistor is achieved by an NMOS transistor (NM10 transistor) of which a drain electrode and a gate electrode are in short circuit, a drain electrode of the NN10 transistor is connected to a drain electrode of the NM9 transistor, and a source electrode of the NM10 transistor is grounded. The clamping diode of the NM12 transistor is achieved by an NMOS transistor (NM11 transistor) of which a drain electrode and a gate electrode are in short circuit, a drain electrode of the NM11 transistor is connected to a drain electrode of the NM12 transistor, and a source electrode of the NM11 transistor is grounded.

It can be seen from a circuit structure of the delay unit that when the PM8 transistor is switched on, the NM9 transistor is switched off, the PM9 transistor is switched off, the NM12 transistor is switched on, and the current flows to the NM12 transistor, is clamped by the NM11 transistor and then is output from the second output end. When the PM8 transistor is switched on, the NM12 transistor is switched off, the PM3 transistor is switched off, the NM9 transistor is switched on, and the current flows to the NM9 transistor, is clamped by the NM3 transistor and then is output from the first output end.

As described above, an output end of the last-stage delay unit of the ring oscillator is connected to the input end of the first-stage delay unit in an anti-phase manner, that is, the first and second output ends of the third delay unit are connected to the first and second input ends of the first delay unit, that is, an A0 point and an B0 point.

After passing through the odd stages of delay units provided by one embodiment of the present invention, the oscillation signal with clamped amplitudes may be output. It can be understood that since the odd stages of delay units form a loop, the output of any-stage delay unit may be used as the output end of the whole voltage controlled oscillator, for example, in the embodiment shown in FIG. 2, the output end of the voltage controlled oscillator is connected to the input end of the third-stage delay unit, equivalent to the output end of the second-stage delay unit.

As shown in FIG. 2, the oscillation signals output by the voltage controlled oscillator are the point A2 and the point B2, that is, the double-end oscillation signals. Meanwhile, due to the arrangement of the clamping diode, the oscillation signals output by the point A2 and the point B2 are low-amplitude oscillation signals. For making the oscillation signals output by the whole voltage controlled oscillator applied to a phase-locked loop circuit, another embodiment of the present invention further provides an output conversion module (DTS module) which can amplify the low-amplitude oscillation signals output by the point A2 and the point B2 into full-amplitude oscillation signals and convert the full-amplitude oscillation signals into oscillation output signals output by a single end.

Likewise, as shown in FIG. 2, the output conversion module (DTS module) includes two NMOS transistors NM13, NM14 and two PMOS transistors PM10, PM11. Gate electrodes of the NM13 transistor and the NM14 transistor are separately connected to double-end output ends of the current controlled oscillation module (CCO module), that is, the point A2 and a point B2 in the figure. A gate electrode of the PM10 is connected to the supply voltage VDD, a drain electrode of the PM10 is connected to a drain electrode of the NM13 transistor, and the gate electrode and the drain electrode of the PM10 are in short circuit and are connected to the gate electrode of the PM11. A source electrode of the PM11 is connected to the supply voltage VDD, and a drain electrode of the PM11 is connected to a drain electrode of the NM14 to form the output end FOUT of the output conversion module.

According to the output conversion module (DTS module), the low-amplitude oscillation signal output by the current controlled oscillation module may be amplified into a full-amplitude oscillation signal, and the double-end oscillation signals are converted into the single-end oscillation output signals, accordingly, the full-amplitude single-end oscillation output signals may be compatibly applied to a rear-end device of the voltage controlled oscillator, and normal operation of the rear-end device is not affected.

Figure 3A:
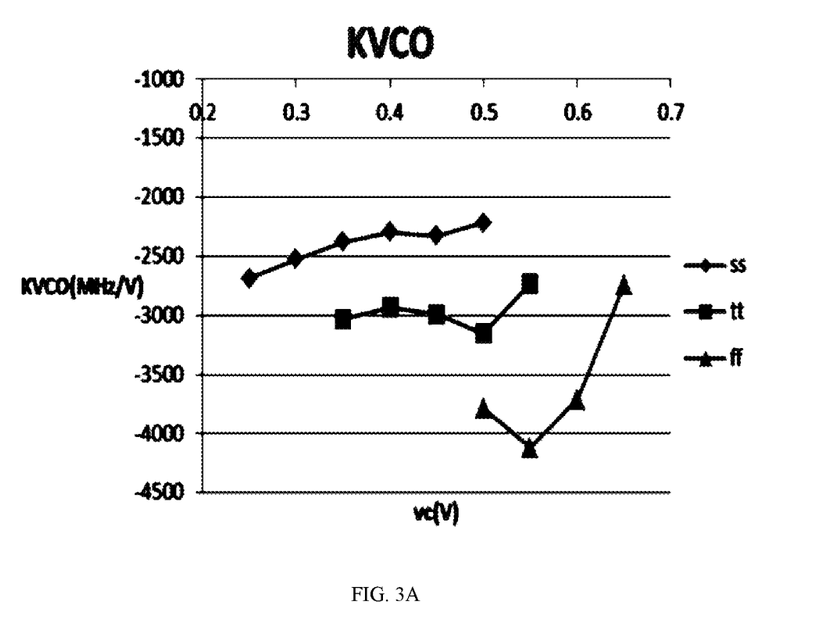
FIGS. 3A and 3B show voltage controlled gain and voltage correlations in voltage controlled oscillators in the prior art and in the present invention, respectively.
Figure 3B:
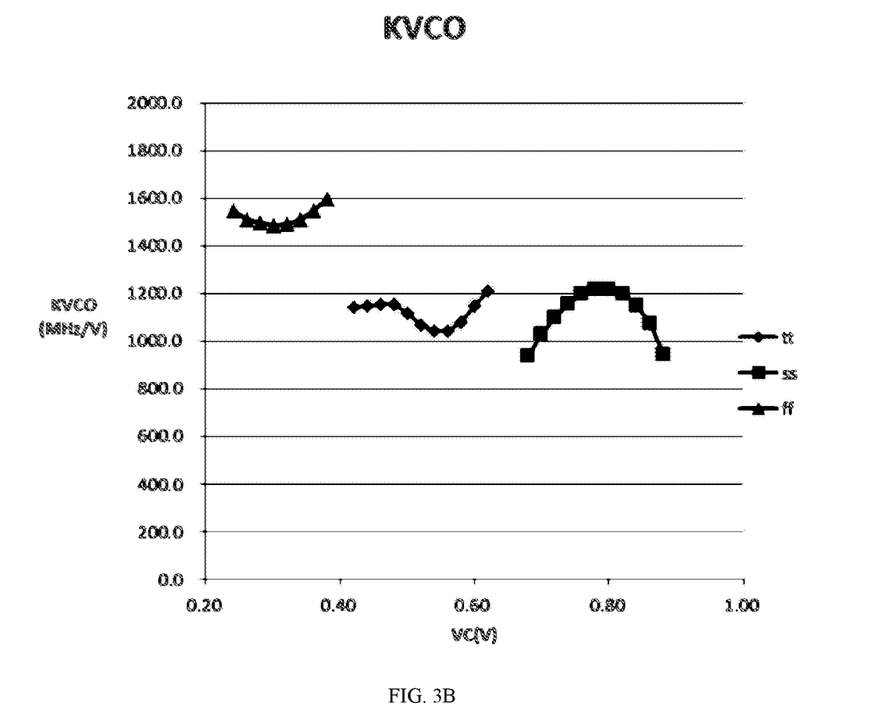

FIGS. 3A and 3B show voltage controlled gains of the voltage controlled oscillators in the prior art and in the present invention, respectively. It can be seen from a relation between the voltage controlled gain Kvco of the voltage controlled oscillator in the prior art and the input control voltage VC, as shown in FIG. 3A, the voltage controlled gain Kvco of the voltage controlled oscillator in the prior art deviates greatly and is not stable enough. It can be seen from a relation between the voltage controlled gain Kvco of the voltage controlled oscillator provided in the present invention and the input control voltage VC, as shown in FIG. 3B, the voltage controlled gain Kvco of the voltage controlled oscillator provided in the present invention deviates less and has good stableness.

Meanwhile, according to tests, when the oscillation of the voltage controlled oscillator is 370M, the power consumption of a voltage controlled oscillator structure in the prior art is 230 uA, and the power consumption of the voltage controlled oscillator structure provided by the present invention is 100 uA, that is, according to the voltage controlled oscillator structure provided by the present invention, the power consumption of a circuit may be effectively reduced, and the performance of the voltage controlled oscillator may be improved.

The voltage controlled oscillator structure provided in one embodiment of the present invention has been described. According to the voltage controlled oscillator structure provided by one embodiment of the present invention, the voltage controlled oscillator is guaranteed to have relatively high voltage to frequency linearity by means of the voltage-to-current conversion module, and the current controlled oscillation module outputs a low-amplitude oscillation signal to reduce the power consumption of the voltage controlled oscillator, thereby achieving design indexes of low power consumption and high linearity of the voltage controlled oscillator, a gain Kvco of the voltage controlled oscillator is relatively stable, the voltage controlled oscillator can be expect to have improved device performance, and possibility is provided for further constructing a phase-locked loop with desirable performance.

Figure 4:
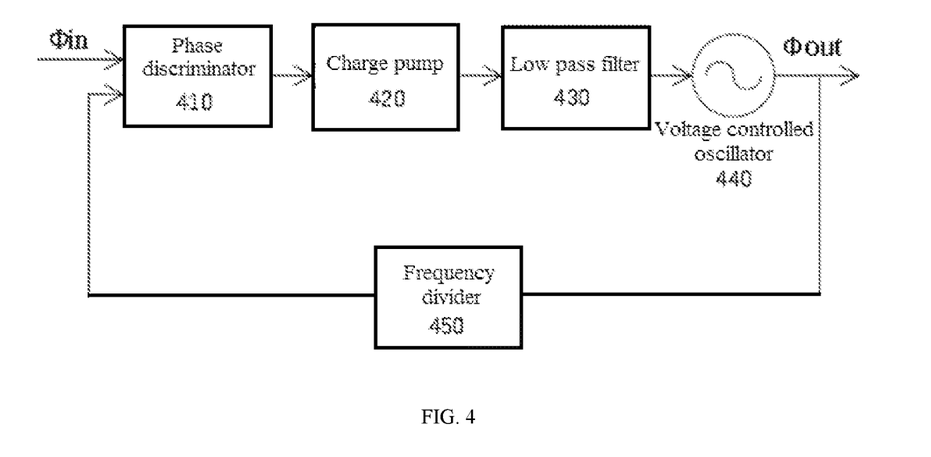
FIG. 4 shows a schematic block diagram of a phase-locked loop circuit according to another embodiment of the present invention.

Another embodiment of the present invention provides a phase-locked loop structure. As shown in FIG. 4, the phase-locked loop structure mainly includes: a phase discriminator 410, a charge pump 420, a filter 430, a voltage controlled oscillator 440, and a frequency divider 450. The voltage controlled oscillator 440 described above may employ any of the embodiments of the voltage controlled oscillator structure described above. Therefore, the low power consumption of the provided phase-locked loop structure may be guaranteed, and the device performance of the phase-locked loop structure may be guaranteed. It can be understood that the specific implementation methods of the specific structure of the phase-locked loop structure and other structures except the voltage controlled oscillator structure should not unduly limit the protection range of the present invention, and the voltage controlled oscillator structure provided by the present invention may be applied to any phase-locked loop circuit structure needing the voltage controlled oscillator. The phase-locked loop structure applying the voltage controlled oscillator structure provided by one embodiment of the present invention should fall within a protection range claimed by the present invention.

Therefore, the embodiments of the voltage controlled oscillator structure and the phase-locked loop including the same provided by the present invention have been described. While the present disclosure has been described by means of specific exemplary embodiments, it will be apparent that various modifications and changes may be made to these embodiments without departing from the broader spirit and scope of the present disclosure. Accordingly, the description and accompanying drawings should be deemed as an illustrative meaning rather than a restrictive meaning.

It should be appreciated that the description is not to be used to interpret or limit the scope or meaning of the claims. In addition, in the foregoing detailed description, it can be seen that various features are combined together in a single embodiment for the purpose of simplifying the present disclosure. This method of the present disclosure should not be interpreted as reflecting an objective that the claimed embodiments require more features than those are expressly recited in each claim. On the contrary, as the appended claims reflect, an inventive subject matter lies in employing features less than all features of a single disclosed embodiment. Thus, the appended claims are hereby incorporated into the detailed description, with each claim standing on its own as a separate embodiment.

One embodiment, or a particular feature, structure, or characteristic described in conjunction with the embodiments, referred in this description are included in at least one embodiment of a circuit or method. A phrase, one embodiment, appearing in various places in the description do not necessarily all refer to the same embodiment.

What is claimed is:

1. A voltage controlled oscillator circuit, comprising:
a voltage-to-current conversion module, wherein the voltage-to-current conversion module converts a control voltage VC of the voltage controlled oscillator into a control current IM,
wherein the control current IM is a linear function of the control voltage VC; and
a current controlled oscillation module, wherein the current controlled oscillation module inputs the control current IM and outputs a low-amplitude oscillation signal to reduce power consumption;
wherein the current controlled oscillation module comprises fully differentiated ring oscillators;
wherein the current controlled oscillation module comprises n stages of anti-phase cascaded delay units, wherein an output of a last-stage of the n stages of anti-phase cascaded delay units is connected to an input terminal of a first-stage of the n stages of anti-phase cascaded delay units in an anti-phase manner, wherein n is an odd number greater than 1,
wherein each of the n stages of anti-phase cascaded delay units comprises: a current control module and a pair of differential transistors;
wherein the current control module controls a flow direction of a current, so as to switch on or switch off the pair of differential transistors;
wherein the pair of differential transistors outputs the low-amplitude oscillation signal.
wherein the current control module comprises a first PMOS transistor, a second PMOS transistor, and a third PMOS transistor;
wherein a gate electrode of the first PMOS transistor connects to an input end of the current control module;
wherein a source electrode of the first PMOS transistor connects to a supply voltage;
wherein a drain current of the first PMOS transistor mirrors the control current IM; and a drain electrode of the first PMOS transistor connects to source electrodes of the second PMOS transistor and the third PMOS transistor.

2. The voltage controlled oscillator circuit of claim 1, wherein the pair of differential transistors comprises a first NMOS transistor and a second NMOS transistor, wherein each of the first and the second NMOS transistors is connected with a clamping diode respectively; wherein
a gate electrode of the first NMOS transistor and a gate electrode of the second PMOS transistor are connected to form a first input end of the n stages of anti-phase cascaded delay units;
a gate electrode of the second NMOS transistor and a gate electrode of the third PMOS transistor are connected to form a second input end of the n stages of anti-phase cascaded delay units;
a drain electrode of the first NMOS transistor and a drain electrode of the second PMOS transistor are connected to form a first output end of the n stages of anti-phase cascaded delay units;
a drain electrode of the second NMOS transistor and a drain electrode of the third PMOS transistor are connected to form a second output end of the n stages of anti-phase cascaded delay units;
a first clamping diode of the first NMOS transistor is connected between a source electrode and the drain electrode of the first NMOS transistor, and a positive electrode of the first clamping diode is the drain electrode of the first NMOS transistor; and
a second clamping diode of the second NMOS transistor is connected between a source electrode and the drain electrode of the second NMOS transistor, and a positive electrode of the second clamping diode is the drain electrode of the second NMOS transistor.

3. The voltage controlled oscillator circuit of claim 2, wherein the first clamping diode is a third NMOS transistor with a gate electrode and a drain electrode in short circuit, wherein the drain electrode of the third NMOS transistor is connected to the drain electrode of the first NMOS transistor, and wherein a source electrode of the third NMOS transistor is connected to the source electrode of the first NMOS transistor; and
wherein the second clamping diode is a fourth NMOS transistor with a gate electrode and a drain electrode in short circuit, wherein the drain electrode of the fourth NMOS transistor is connected to the drain electrode of the second NMOS transistor, and wherein a source electrode of the fourth NMOS transistor is connected to the source electrode of the second NMOS transistor.

4. The voltage controlled oscillator circuit of claim 1, wherein the voltage controlled oscillator circuit further comprises an output conversion module, wherein the output conversion module amplifies double-end oscillation signals output from the fully differentiated ring oscillators and converts the double-end oscillation signals into a single-end oscillation output signal.

5. The voltage controlled oscillator circuit of claim 3, wherein the output conversion module comprises a fifth NMOS transistor, a sixth NMOS transistor, a fourth PMOS transistor and a fifth PMOS transistor;
wherein a gate electrode of the fifth NMOS transistor and a gate electrode of the sixth NMOS transistor are connected to double output ends of the fully differentiated ring oscillators respectively;
wherein a drain electrode of the fifth NMOS transistor is connected to a drain electrode of the fourth PMOS transistor, wherein the drain electrode and a gate electrode of the fourth PMOS transistor are in short circuit and are connected to the gate electrode of the fifth PMOS transistor; and
wherein a drain electrode of the fifth PMOS transistor and a drain electrode of the sixth NMOS transistor are connected to form an output end of the output conversion module.

6. The voltage controlled oscillator circuit of claim 5, wherein the voltage-to-current conversion module comprises a seventh NMOS transistor and an eighth NMOS transistor;
wherein a gate electrode of the seventh NMOS transistor and a gate electrode of the eighth NMOS transistor are connected to the control voltage VC, and a drain electrode of the seventh NMOS transistor and a drain electrode of the eighth NMOS transistor are connected in parallel to output the control current IM; and
wherein the seventh NMOS transistor and the eighth NMOS transistor have different threshold voltage intervals, so as to expand an available range of the control voltage VC of the voltage-to-current conversion module.

7. The voltage controlled oscillator circuit of claim 6, wherein the seventh NMOS transistor is a depletion NMOS transistor, and the eighth NMOS transistor is an enhanced NMOS transistor; or
wherein the seventh NMOS transistor is an enhanced NMOS transistor, and the eighth NMOS transistor is a depletion NMOS transistor.

8. The voltage controlled oscillator circuit of claim 6, wherein a source electrode of the seventh NMOS transistor connects to a first end of a first resistor, and a second end of the first resistor is grounded, and wherein a source electrode of the eighth NMOS transistor connects to a first end of a second resistor and the second end of the second resistor is grounded, so as to improve the linearity between the control voltage VC and the control current IM.

9. The voltage controlled oscillator circuit of claim 5, wherein the voltage controlled oscillator circuit further comprises a sixth PMOS transistor, wherein the control current IM from the output of the voltage-to-current conversion module is mirrored to the current controlled oscillation module by means of the sixth PMOS transistor.

10. A phase-locked loop device, comprising a phase discriminator, a filter, a frequency divider, and the voltage controlled oscillator circuit of claim 1.

11. A voltage controlled oscillator circuit, comprising:
a voltage-to-current conversion module, wherein the voltage-to-current conversion module converts a control voltage VC of the voltage controlled oscillator into a control current IM,
wherein the control current IM is a linear function of the control voltage VC; and
a current controlled oscillation module, wherein the current controlled oscillation module inputs the control current IM and outputs a low-amplitude oscillation signal to reduce power consumption;
wherein the current controlled oscillation module comprises fully differentiated ring oscillators;
wherein the current control module comprises a first PMOS transistor, a second PMOS transistor, and a third PMOS transistor, wherein:
a gate electrode of the first PMOS transistor connects to an input end of the current control module;
a source electrode of the first PMOS transistor connects to a supply voltage; and
a drain current of the first PMOS transistor mirrors the control current IM, and a drain electrode of the first PMOS transistor connects to source electrodes of the second PMOS transistor and the third PMOS transistor;
wherein a pair of differential transistors comprises a first NMOS transistor and a second NMOS transistor, wherein each of the first and the second NMOS transistors is connected with a clamping diode respectively;
wherein a gate electrode of the first NMOS transistor and a gate electrode of the second PMOS transistor are connected to form a first input end of the n stages of anti-phase cascaded delay units;
wherein a gate electrode of the second NMOS transistor and a gate electrode of the third PMOS transistor are connected to form a second input end of the n stages of anti-phase cascaded delay units;
wherein a drain electrode of the first NMOS transistor and a drain electrode of the second PMOS transistor are connected to form a first output end of the n stages of anti-phase cascaded delay units;
wherein a drain electrode of the second NMOS transistor and a drain electrode of the third PMOS transistor are connected to form a second output end of the n stages of anti-phase cascaded delay units;
wherein the voltage controlled oscillator circuit further comprises an output conversion module, wherein the output conversion module amplifies double-end oscillation signals output from the fully differentiated ring oscillators and converts the double-end oscillation signals into a single-end oscillation output signal;
wherein the output conversion module comprises a third NMOS transistor, a fourth NMOS transistor, a fourth PMOS transistor and a fifth PMOS transistor;
wherein a gate electrode of the third NMOS transistor and a gate electrode of the fourth NMOS transistor are connected to double output ends of the fully differentiated ring oscillators respectively;
wherein a drain electrode of the third NMOS transistor is connected to a drain electrode of the fourth PMOS transistor, wherein the drain electrode and a gate electrode of the fourth PMOS transistor are in short circuit and are connected to the gate electrode of the fifth PMOS transistor;
wherein a drain electrode of the fifth PMOS transistor and a drain electrode of the fourth NMOS transistor are connected to form an output end of the output conversion module;

wherein a first clamping diode of the first NMOS transistor is connected between a source electrode and the drain electrode of the first NMOS transistor, and a positive electrode of the first clamping diode is the drain electrode of the first NMOS transistor; and wherein a second clamping diode of the second NMOS transistor is connected between a source electrode and the drain electrode of the second NMOS transistor, and wherein a positive electrode of the second clamping diode is the drain electrode of the second NMOS transistor.

12. The voltage controlled oscillator circuit as in claim 11, wherein the voltage-to-current conversion module comprises a fifth NMOS transistor and a sixth NMOS transistor;

wherein a gate electrode of the fifth NMOS transistor and a gate electrode of the sixth NMOS transistor are connected to the control voltage VC, and a drain electrode of the fifth NMOS transistor and a drain electrode of the sixth NMOS transistor are connected in parallel to output the control current IM; and wherein the fifth NMOS transistor and the sixth NMOS transistor have different threshold voltage intervals, so as to expand an available range of the control voltage VC of the voltage-to-current conversion module.

13. The voltage controlled oscillator circuit of claim 12, wherein the fifth NMOS transistor is a depletion NMOS transistor, and the sixth NMOS transistor is an enhanced NMOS transistor; or wherein the fifth NMOS transistor is an enhanced NMOS transistor, and the sixth NMOS transistor is a depletion NMOS transistor.

14. The voltage controlled oscillator circuit of claim 12, wherein a source electrode of the fifth NMOS transistor connects to a first end of a first resistor, and a second end of the first resistor is grounded, and wherein a source electrode of the sixth NMOS transistor connects to a first end of a second resistor and the second end of the second resistor is grounded, so as to improve the linearity between the control voltage VC and the control current IM.

15. The voltage controlled oscillator circuit of claim 12, wherein the voltage controlled oscillator circuit further comprises a sixth PMOS transistor, wherein the control current IM from the output of the voltage-to-current conversion module is mirrored to the current controlled oscillation module by means of the sixth PMOS transistor.

16. A phase-locked loop device, comprising a phase discriminator, a filter, a frequency divider, and the voltage controlled oscillator circuit of claim 11.

* * * * *